United States Patent [19]

Hegeler

[11] Patent Number: 4,727,331

[45] Date of Patent: Feb. 23, 1988

[54] WARNING TONE SIGNAL GENERATOR

[75] Inventor: Wilhelm Hegeler, Bad Salzdetfurth, Fed. Rep. of Germany

[73] Assignee: Blaupunkt Werke GmbH, Hildesheim, Fed. Rep. of Germany

[21] Appl. No.: 18,842

[22] Filed: Feb. 24, 1987

Related U.S. Application Data

[63] Continuation of Ser. No. 664,335, Oct. 24, 1984, abandoned.

[30] Foreign Application Priority Data

Nov. 11, 1983 [DE] Fed. Rep. of Germany ....... 3340808

[51] Int. Cl.$^4$ .......................... H03K 3/01; H03K 5/22
[52] U.S. Cl. ...................... 328/59; 328/109; 377/39; 307/271; 307/265
[58] Field of Search ............... 307/265, 228, 260, 269, 307/271; 377/39, 44, 47; 328/59, 63, 72; 331/51, 55; 455/205, 208, 228; 328/111, 110, 109

[56] References Cited

U.S. PATENT DOCUMENTS

| | | | |
|---|---|---|---|
| 3,719,897 | 3/1973 | Tarr | 377/39 |
| 3,836,908 | 9/1974 | Hegendorfer | 377/39 |
| 3,838,413 | 9/1974 | Wehermann | 328/59 |
| 3,870,963 | 3/1975 | Groce et al. | 328/59 |
| 3,914,580 | 10/1975 | Watson et al. | 328/39 |

Primary Examiner—Stanley D. Miller
Assistant Examiner—Timothy P. Callahan
Attorney, Agent, or Firm—Frishauf, Holtz, Goodman & Woodward

[57] ABSTRACT

Pulses of constant pulse frequency but varying duty cycle are generated in a pulse generator which provides pulse trains or pulse sequences, as controlled by a pulse train or pulse length or sequence control unit coupled to the pulse generator and controlling the pulse generator to emit a train or sequence of pulses of similar pulse lengths, and further including a pulse length modulation control unit (12) coupled to the pulse generator and to the pulse train or sequence control unit, to control the length of the pulses of the individual pulse trains, the pulse lengths increasing in sequential pulse trains to provide an output signal of increasing intensity. The output from the pulse generator is filtered with respect to the base frequency, for example 800 Hz, and generated square wave pulses are converted into sawtooth wave pulses by a RC circuit to increase the dynamic range of output obtainable. The pulse generator (10), the pulse train length control unit (11) and the pulse length modulation control unit (12) can all form part of a digital microprocessor, generating the pulses, with intervening intervals to provide for a warning tone rhythm, the intervening intervals permitting the microprocessor to carry out calculating functions other than pulse generation for the warning tone.

19 Claims, 4 Drawing Figures

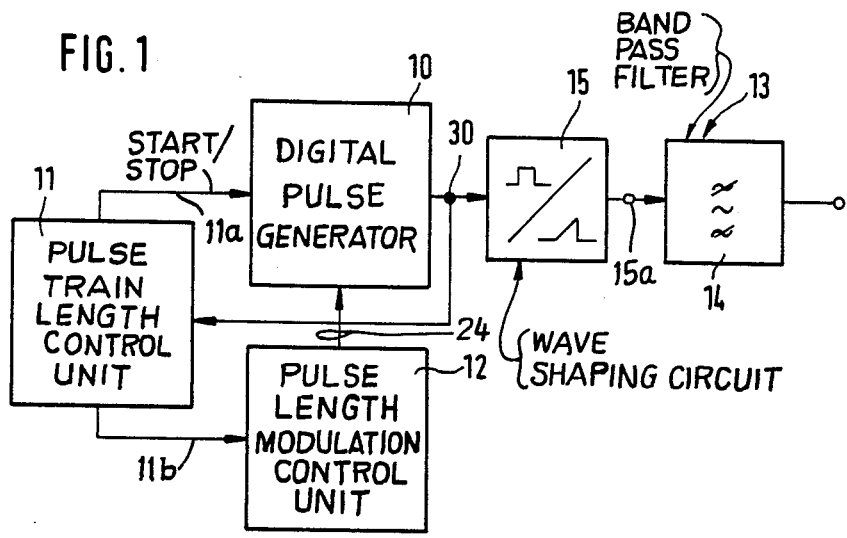
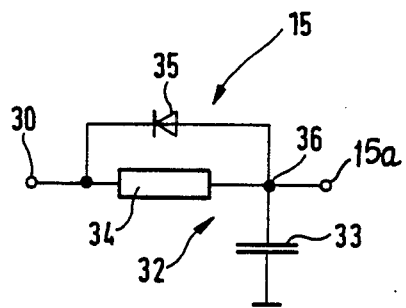
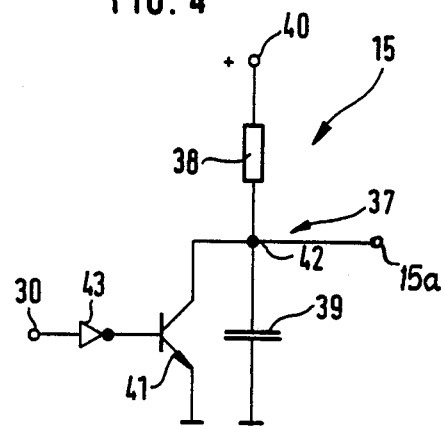

WARNING TONE SIGNAL GENERATOR

This application is a continuation of application Ser. No. 644,335, filed 10/24/84, now abandoned.

Reference to related patents, assigned to the assignee of this application, and incorporated herein by reference: U.S. Pat. No. 3,949,401, HEGLER et al, issued Apr. 6, 1976; U.S. Ser. No. 319,654, filed Nov. 9, 1981, BRAGAS and EILERS, now U.S. Pat. No. 4,435,843, issued Mar. 6, 1984; U.S. Ser. No. 319,655, filed Nov. 9, 1981, BRAGAS and EILERS, now U.S. Pat. No. 4,450,589, issued May 22, 1984.

The present invention relates to a tone signal generator, and more particularly to a tone signal generator which can generate a warning tone within a predetermined frequency band by digital circuitry, and which is especially useful as a warning tone signal generator for mobile, or automotive radio receivers to provide a warning tone signal, the intensity of which increases, so that the perceived loudness of the warning tone rises, to attract specific attention.

BACKGROUND

Various types of warning signals, or other audible tone generators are known; some of these tone generators provide a warning tone signal, in which the audible intensity gradually increases. Warning tone generators of this type are particularly important for incorporation in automobile, or other mobile receivers in which ambient noise level may be variable, and in which the operator's attention can be distracted by numerous external influences, for example attention to traffic and the like; nevertheless, the warning tone should not only be heard, but considered by the operator. Changing the intensity of the warning tone attracts attention.

Various automobile receivers, and other mobile receivers are equipped with arrangements to receive special broadcasts, such as emergency warnings or the like. Transmitters which are equipped to provide such special broadcasts radiate a radio station, or region recognition signal, hereinafter RR signal, which indicates that the particular station is equipped to provide the special announcement. As a vehicle travels along a highway away from the particular transmitter to which is tuned and which radiates the RR signal, the operator should be warned that he is leaving the region of a transmitter which provides these special announcements. It is, therefore, desirable to provide an audible indication to the operator of the vehicle that he is leaving the reception range of a transmitter which furnishes the special announcements, so that the operator may return the receiver, or place the receiver into a search mode to automatically select another transmitter, for example geographically closer to the vehicle as it is then positioned, and which will also radiate the appropriate announcements.

In order to provide an audible indication to the operator of the warning signal, it has been proposed to use special warning tone oscillators, warning tone or spiral generators, and the like, coupled to control apparatus to vary the audio intensity. All such apparatus requires substantial circuitry.

THE INVENTION

It is an object to provide a tone or tone signal generator which is simple to construct and which, preferably, uses existing digital circuitry, for example present in a microprocessor, to generate a tone of increasing intensity.

Briefly, a pulse generator provides pulses having a constant pulse frequency, but varying both in pulse and gap lengths, or duty cycle. A pulse length control unit is coupled to the pulse generator to control the pulse generator to emit a sequence of pulses of similar pulse lengths for a first sequence, but, at least in a subsequent sequence of pulses, the length of the pulses is controlled to be longer than the pulse length of the preceding sequence. A filter, preferably a bandpass filter, is provided, connected to receive the pulses from the pulse generator and providing the tone output signal. The pass range of the filter is selected to match the essentially constant frequency of the pulse generator.

The tone generator, thus, generates sequential pulse sequences of constant pulse frequency and pulses of constant pulse length, or duration. In sequential pulse sequences, or in groups of temporally adjacent pulse sequences with an intervening pause, the pulse length is generally increased. By filtering, the tone base frequency is derived from the pulse sequence which, as a warning tone or warning signal, is then audible, having a predetermined warning tone rhythm.

The warning signal will be a series of beeps of uniform frequency, or pitch and of rising amplitudes.

The pulse lengths modulation of the pulses within one sequence permits, in a simple manner, to vary the loudness, or tone intensity. By suitable selection of the time duration of the individual pulse sequences, the portion of the tone signal having the respective loudness levels and the warning tone rhythm can be easily controlled. The frequency of the warning tone is determined by the basic frequency wave portion contained within the pulse sequences. The pulse generator, as well as the control unit for the pulse length modulation, or pulse length control, can be easily made and constructed with little apparatus, particularly when constructed in digital form.

In accordance with a preferred feature of the invention, the pulse generator which, normally, provides at least approximately square wave pulses, has a sawtooth wave shaping circuit connected thereto before the pulses are transmitted to the filter, typically the bandpass filter.

The pulse generator and the control unit for the pulse duration, as well as a control unit for the duration of the pulse sequences may be a microprocessor. Under such conditions, particularly when the microprocessor is used, the range of possible pulse lengths modulation with respect to variation of the intensity of the tone cannot be freely selected, thus limiting the dynamic range which can be achieved. By deforming square wave pulses into sawtooth wave pulses, for example, it is possible to effectively double the dynamic range. The output level, that is, the loudness of a square wave pulse, has an essentially linear relationship to the pulse duration, or or pulse length, corresponding to the base frequency if the pulse duration is short with respect to the cycle duration. The output level, and hence the loudness of a tone generated by a sawtooth wave, however, has a quadratic relationship with respect to the base frequency, and thus with respect to the pulse duration, or length. Consequently, the dynamic range is enhanced.

In a particularly desirable construction, the control units, and the pulse generators, all are components within a microprocessor. If the microprocessor has an output transistor with an open drain, or collector output, a wave-shaping circuit to generate the sawtooth waves can be readily obtained by connecting a series R/C circuit to a source of direct current and connecting the junction point of the serial resistor and capacitor element of the R/C circuit to the open drain or collector output, respectively, which terminal will then, simultaneously, form the output of the wave-shaping circuit generating the sawtooth wave. This construction is particularly economical with regard to use of components, and hance wiring thereof.

Use of a microprocessor is particularly desirable, since vehicular radios, and particularly vehicular radios capable of receiving announcement from special transmitters which emit the RR signals already include microprocessors in order to process the respective signals emitted by the transmitters. Systems of this kind have been described in the literature, and one such arrangement is described in U.S. Pat. No. 3,949,401 Hegeler et al.

Automobile radios which already include microprocessors can be readily arranged and programmed so that the microprocessor will provide the pulse generator as well as the control unit. Already existing components within the microprocessor can, then, be used to generate a warning tone signal. The only additional elements which are needed are peripheral components, such as the bandpass filter and the wave-shaping circuit to generate the sawtooth wave. To obtain the warning tone it is only necessary to connect to a one pin output of the microprocessor, for example to an open collector, or open drain connection.

DRAWINGS

FIG. 1 is a schematic block circuit diagram of a tone generator in accordance with the present invention, and forming a warning tone generator for mobile traffic and announcement receiving radio receivers;

FIG. 3 is a circuit diagram to provide a sawtooth wave output, and

FIG. 4 is a circuit diagram of a wave-shaping circuit to provide square wave output, particularly adapted for use with a microprocessor.

DETAILED DESCRIPTION

Figure 2:
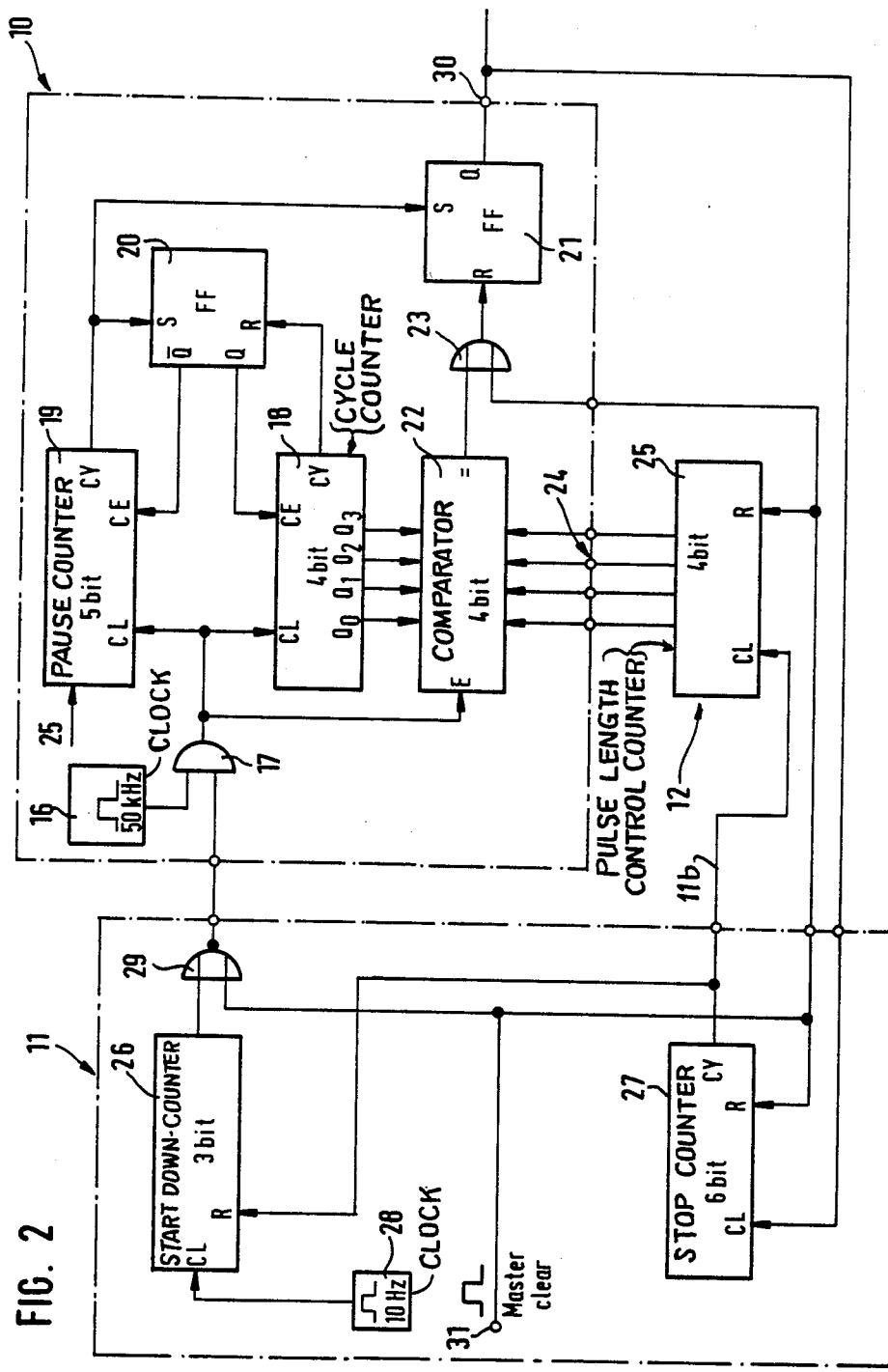
FIG. 2 is a detailed circuit diagram illustrating an embodiment of a pulse generator and a control unit for pulse length modulation, as well as a control unit for pulse sequencing of the tone generator of FIG. 1.

The invention will be described in connection with a warning tone generator for traffic announcement receivers. A digital pulse generator 10 generates square wave pulses of constant pulse frequency but controllable pulse lengths, or pulse duration. The overall duration of a pulse sequence, or pulse train is determined by a pulse train, or pulse sequence length control unit 11. Unit 11 provides a start signal and a stop signal to the pulse generator 10 on line 11a. The length of the pulses, or the pulse duration of the individual pulses, to effect pulse length modulation, is controlled by a pulse length modulation control unit 12. The pulse length modulation control unit 12 is connected to and controls the digital pulse generator 10 in such a manner that the pulse lengths of the individual square wave pulses in each sequence, or train of pulses at the output of the pulse generator 10, is constant; subsequent pulse trains or sequences, however, will have increasing pulse lengths; thus, the pulse lengths, or pulse duration of the pulses in subsequent pulse trains will increase. The pulse generator is connected through the wave-shaping circuit 15—which is not strictly necessary but highly desirable and preferred, and which will be explained below—to a filter element 13, constructed as a bandpass filter 14. The wave-shaping circuit 15, connected between the output terminal 30 from the digital pulse gnerator 10 and the filter 13 converts the square wave pulses to sawtooth-shaped pulses, as schematically indicated in FIG. 1, to enhance the dynamic range of variation obtainable. The sawtooth waves are formed with a rising sloping portion and then have an essentially vertically sharply dropping-off portion. The pulse repetition lengths, and the pulse frequency, are not affected by the wave-shaping circuit 15.

The pulse train length control unit 11 is, further, connected to the pulse length modulation control unit 12. In any one tone output, the pulse train lengths control unit 11 also establishes a count of the number of pulse trains, or pulse sequences, which are to be emitted. The respective number, first pulse train, second pulse train ... and so on, as determined by unit 11, is transmitted over line 11b to the pulse length modulation control unit 12 to provide information to the pulse length modulation control unit 12 that a subsequent or further train will be generated and that, hence, the pulse length should be enhanced, or increased.

The digital pulse generator 10, the pulse train length control unit 11 and the pulse length modulation control unit 12 are all constructed in digital mode. FIG. 2 illustrates the respective elements and their interconnection. The particular circuit elements are all units which are available in various microprocessors, and typically in the microprocessor of an announcement receiving mobile, or automobile radio receiver.

Pulse generator 10 has a clock 16 which provides clock pulses at a frequency of 50 kHz. The output of generator 16 is connected over an AND circuit 17 to the clock input CL of a cycle counter 18 and a pause counter 19. The pause counter 19 is a controllable 5-bit counter and determines the pauses between sequential pulse cycles within a pulse sequence, or pulse train. The pause counter 19 is set to count to "25" so that the carry output CY of the pause counter 19 will provide an output signal after $25 \times 1/50$ kHz$=0.5$ milliseconds. The cycle counter 18 is a 4-bit counter and determines the pulse period or pulse cycling of the pulses of a pulse train. The carry output of the pause counter 19 is connected to the SET input S of a flipflop (FF) 20. The carry output CY of the cycle counter 18 is connected to the RESET input R of the FF 20. The Q output of the FF 20 is connected to the clock enable input CE of the pause coounter 19. The carry output CY of the pause counter 19 is further connected to the SET input S of a further FF 21.

The count outputs $Q_0$, $Q_1$, $Q_2$, $Q_3$ of the cycle counter 18 are connected to a 4-bit comparator 22. The 4-bit comparator 22 has an ENABLE-input E connected to the output of the AND gate 17. The output of comparator 22 is connected over OR gate 23 to the RESET input R of the further FF 21. The remaining 4-bit inputs of the comparator 22, to provide the comparison inputs, are connected to input terminals 24 of the pulse generator which, in turn, are connected to the pulse length modulation control unit 12. The pulse length modulation control unit 12 is formed by a pulse length control counter 25, which has a count capacity of four bits. The clock input CL of counter 25 is connected to line 116 from the pulse train length control unit 11.

The pulse train length control unit 11 has a start counter 26 and a stop counter 27. The start counter 26 is formed by a 3-bit down counter, having a clock input connected to a clock generator 28, providing an output clock frequency of 10 Hz. The output of the start counter 26 is connected through a NOR gate 29 with the second input of the AND gate 17 of the pulse generator 10. The stop counter 27 is a 6-bit counter, the clock input CL of which is connected to the Q-output of the further FF 21 which, also, forms the terminal 30 of the digital pulse generator. The stop counter 27 counts the square wave pulses arising at the output of the FF 21 and, when it has reached its count capacity of 64, provides a pulse at the carry output CY of counter 27. The carry output is connected to the RESET input R of the start counter 26 to reset the start counter, and further provides a count pulse to the clock input CL of the pulse length control counter 25.

The start counter 26 and the stop counter 27 determine the number of pulses within the pulse train and the pause, or gap between sequences, or trains of pulses, and thus the rhythm of the warning tone.

A master clear terminal 31 is provided to determine a start switching or circuit condition upon initiatio of a warning tone. It is connected to the second input of the NOR gate 29, to the RESET input R of the stop counter 27 and to the RESET input R of the pulse length control counter 25. It is, additionally, connected to the second input of the OR gate 23 between the comparator 22 and the RESET input R of the further FF 21.

OPERATION

Upon first applying a pulse to the master clear input 31, all elements are brought into their rest or start position. All counters, except the start counter 26, will have a 0-signal at the output thereof. The start counter 26, since it is a down counter, will assume its highest-bit state and thus will provide a logic 1-signal. Only after the start counter has counted down eight count pulses, will it reach the 0-signal position at its output.

The 0-output of the start down counter 26 will occur after eight count cycles defining a predetermined number at the frequency of 10 Hz, that is, after 0.8 seconds (800 ms). At that time, the AND gate 17 will be SET, or enabled, and the clock pulses at the rate of 50 KH3 from the clock generator 16 will be applied to the clock inputs CL of both the cycle counter 18 and the pause counter 19. FF20 is initially in RESET state. The $\overline{Q}$ output of the FF 20 has a 1-signal; the Q output of the FF 2 will have a logic 0-signal. This enables the pause counter 19, while blocking the cycle counter 18. When the pause counter 19 has counted to its count state of 25, that is, after 0.5 ms, the carry pulse at the carry output CY of the pause counter 19 causes the FF 20 to be SET, so that the two outputs of the FF 20 change their polarity. Upon change of polarity, the cycle counter 18 will be enabled because a 1-signal will be applied to the counter enable terminal CE thereof, whereas the pause counter 19 is blocked from counting subsequent clock pulses.

The carry pulse CY from the pause counter 19 has an additional effect: it SETS the further FF 21. The Q output of the FF 21 will have a logic 1-signal thereon, which, then, forms the output 30 of the pulse generator. With the next clock pulse of the clock pulse generator 16, transmitted through AND gate 17, comparator 22 will be enabled. The comparator compares the count state of the two counters 18 and 25. At the initial state, the count state of both counters will be zero, so the output of the comparator will provide a logic 1-signal which, over OR gate 23, RESETS the FF 21. The Q output of FF 21 thus changes to a zero signal, and the output 30 of the pulse generator will assume the logic state zero. Consequently, the output 30 of the pulse generator has received a pulse having a pulse length, or pulse duration, of 0.02 ms.

Each further pulse of the clock generator 16 causes the cycle counter 18 to count upwardly by one step until its count capacity of 16 as been reached. During the preceding 15 count pulse steps, the count state of the cycle counter 18 will differ from the count state of the pulse length counter 25 which, continuously, will be zero. Consequently, the output of the comparator 22 will be, continuously, a logic 0-signal. The further FF 21 will remain RESET, and its Q output, and hence the signal at terminal 30 remain at logic zero level. The carry pulse at the carry output CY of the cycle counter 18, upon having reached a count state 16, will RESET the FF 20 over its RESET input R, so that, then, the cycle counter 20 will be blocked, but the pause counter 19 will be released to count, since the CE input of the pause counter will receive a logic 1 signal.

The previously described cycle will repeat 16×20 microseconds (16×0.2 ms) after start of the first pulse at the output 30, that is upon continuing counting of cycle counter 18 until it provies its CY output.

A apuse of 0.5 ms at the output 30 of the pulse generator 10 will then occur. Thereafter, again, a square wave pulse of pulse length of 0.02 ms will appear.

The interplay of the operation of cycle counter 18, pause counter 19, comparator 22, and the respective gates 17, 23, and FF's 20, 21, define a second predetermined number defining the length of any one pulse, and a maximum number corresponding to pulse length plus the length of gaps between succeeding pulses.

Each pulse at the output 30 of the pulse generator 10 has also caused a counting step to occur in the stop counter 27. Let it be assumed that a pulse train is to have 64 pulses, thus defining the length of one beep. The number 64 forms a first predetermined number. After 64 counted pulses, the stop counter 27 has reached its count capacity, and the carry pulse at the carry output CY of the stop counter 27 provides a counting pulse to the count input CL of the pulse length control counter 25 which will set the pulse length control counter to OE and will reset the start counter 26.

Resetting the start counter 26 to its initial count state has a similar effect as providing the master clear pulse, and the initially described sequence will repeat, that is, the down at the rate of 10 Hz counter 26, will count down from its maximum bit state and provide a logic 1-signal. Again, after 800 ms, the zero state at the predetermined number of its counting capacity, i.e., a third predetermined number of the start counter 26 will be reached, which again starts the pulse counter 10 as previously described. The pulse counter 10 will count as before, with this difference: the count state of the pulse length control counter 25 is no longer zero, but is now a ONE. Consequently, the comparator 22 will detect the same count state in the cycle counter 18 and in the pulse length control counter 22 only after two clock pulses derived from the clock generator 16 passed through AND gate 17. The logic 1-signal which resets the FF 21 will thus be applied only after two clock pulses from the clock 16, so that the pulse which appeared at the output terminal 30 of the pulse counter 10 will have a duration twice as long as before, namely 40 microseconds (0.04 ms).

The previously described pulse generation cycle will repeat, except that all the pulses in this second pulse train will have a pulse length of 40 microseconds. The pulse train, as before, will have 64 pulses.

After 64 pulses, at the output of the pulse generator 10, the stop counter 27 RESETS the start counter 26 back to its starting state, and increments the count number in the pulse length control counter 25 to TWO. A pause of 800 ms will then occur; the subsequent pulse train will have pulses of tripled pulse lengths, with respect to the first pulse train or pulse sequence, namely 0.06 ms.

The previously described cycles continue until, in the last pulse train providing the highest level output, the last pulse lengths will be 16×0.02 ms, =0.32 ms.

The pulse trains, thus, will have the same pulse repetition rate, and the same pulse frequency, but with increasing pulse lengths of the individual pulses of each pulse train. The pulses within each pulse train will be the same. The tone generation cycle is terminated, for example by generation of a "STOP" signal from the counter 25; or, if the sequence is to be repeated, by applying such a "STOP" signal, derived, for example, from a carry, or overflow terminal from coutner 25 to the master clear terminal 31 to reinitiate the entire sequence.

The bandpass 14 (FIG. 1), connected to the output 30 of the pulse generator, receives the pulse sequences from the terminal 30. These pulse sequences will have an average frequency of 800 Hz. The base frequency is filtered by the bandpass filter. Thus, a warning tone having a frequency of 800 Hz is provided, the loudness, or intensity of which gradually rises, or increases, with a warning tone rhythm of 1 Hz, which can be applied through the loudspeaker of the receiver.

The pulse generator 10, the pulse train length control unit 11 and the pulse length modulation control unit 12 have been described in the form of hardware; all these functions can be carried out by a microprocessor. Such microprocessors are customarily installed in the automobile radio receivers with announcement recognition reception capability. The 800 ms pause for the warn tone rhythm between the respective pulse trains of each 64 pulses can be used to carry out other calculating operations. The operation of a suitably programmed microprocessor will be the same as that previously described in connection with discrete counters and circuit elements.

The operation of a suitable microprocessor, thus, would be identical to that above described. The warning tone output of the microprocessor is then the same as the terminal 30 of the pulse generator 10. At that terminal, square wave pulses will be received. In sequential pulse trains, each of constant pulse frequency, the pulse duration increases in steps until the maximum value has been attained.

As previously mentioned, the pattern of possible duty cycle in the respective pulse sequence is not freely selectable if a microprocessor is used since the possible calculating or mathematical operations which the microprocessor is to carry out—for efficient operation is limited. Further, a minimum time to generate pulses is needed, which, depending on the type of microprocessor, may be substantially greater than that described, for example, may have to be 64 microseconds. This substantially limits the dynamic range.

The dynamic range can be enhanced by connecting the wave-shaping circuit 15 between the output 30 of the pulse generator 10 and the input of the bandpass filter 14, in which the square wave output pulses at terminal 30 from the pulse generator 10 are converted into sawtooth waves with a gradually rising pulse which then sharply drops off, connected to the input of the bandpass filter. The pulse duration and the pulse frequency of the sawtooth wave pulses correspond to the square wave pulses.

FIG. 3 illustrates a wave-shaping circuit 15 connected to the terminal 30 of the pulse generator 10 and connected as a series-parallel R/C circuit 32 having a resistor 34, serially connected between the output terminal 30 and the output terminal 15a of the wave-shaping circuit 15. A capacitor 33 is serially connected with resistor 34. A discharge diode 35 is connected across the resistor 34, such that the cathode of the discharge diode 35 is connected to the output 30 of the pulse generator 10 and the anode to the junction 36 between resistor 34 and capacitor 33. Of course, it is possible to exchange the sequence of the arrangement of the resistor 34 and capacitor 33.

Due to the inherent or remanent voltage of the diode which, in a silicon diode is approximately 0.6 V, capacitor 33 is discharged only to a voltage of 0.6 V. In very short pulses, in which the peak voltage of the sawtooth wave reaches, at the most, 0.6 V, such a circuit cannot be used effectively, and, actually, may become ineffective. The wave-shaping circuit of FIG. 4 is then preferred.

In FIG. 4, the R/C circuit 37 includes a resistor 38 and a capacitor 39, which are serially connected, and, additionally, connected to a source of direct current 40. Capacitor 39 is connected in parallel with the collector-emitter path of a transistor 41, the base of which is connected through an inverter 43 to the output of the pulse generator 10. The junction 42 between resistor 38 and capacitor 39 again forms the output terminal 15a of the wave-shaping circuit.

The wave-shaping circuit 15 of FIG. 4 operates in the same manner as that one of FIG. 3. The inherent remanent voltage across the transistor, however is only a few ten millivolts, so that, even in very short pulse lengths of the square wave pulses, pulse shaping into a sawtooth shape will occur.

Rather than using a transistor 41, as shown, of course, a field effect transistor (FET) can be used.

The circuit of FIG. 4 has an additional advantage when combined with the system of FIG. 2, if embodied in a microprocessor: many microprocessors have an output terminal including an operational amplifier which has a "open drain", or "open collector" terminal. Such a terminal can be used, thereby eliminating the transistor 41 and the inverter 43, by merely connecting the pin of the microprocessor having the "open collector"—if using a transistor—or the "open drain"—if using a FEt—to the junction terminal 42 between the resistor 38 and capacitor 39, and, also, forming the output terminal 15a of the wave-shaping network, which, then, can be directly connected to the bandpass filter 14.

The sawtooth wave so generated will have an amplitude of the signal which is filtered in the filter circuit 13 proportional to the triangular area, and thus having a quadratic relationship based on pulse duration, or pulse length, of the square wave pulses generated by the pulse generator 10. The quadratic relation, thus, provides for variation of amplitude based on pulse length, that is, on duty cycle, a dynamic range which is substantially wider than that of the originally generated square wave pulses.

Various changes and modifications may be made. For example, immediately following pulse trains resulting in beeps do not always need have an increased pulse length. It is, for example, possible to provide pulse lengths in sequential pulse trains with the same pulse length, so that, for example, four pulse trains of, 64 pulses each, have the same pulse length. The next group of four pulse trains, each of 64 pulses, then again will have a constant pulse length, but raised with respect to that of the preceding group of pulse trains.

It has been found desirable to increase the pulse length not in algebraic steps, but rather to double the pulse lengths of the respective pulses in the sequential pulse trains in which an increase is desirable. Suitable arrangement and programming of the counter 25, which controls the pulse length, will determine the length of the pulses of the respective pulse trains, individually, or in sequence, and hence the amplitude of the beeps.

Counter 25 is prevented from overflowing. In other words, there is no last pulse train—the tone generation is terminated by master clear only, or the volume has to stay at maximum level. Constancy of frequency is obtained this way: The output Q of FF20 is connected to the clock enable input of counter 18, and the inverted output of FF20 is connected to the clock enable input of counter 19. Setting and resetting of FF20 occurs at the overflow condition of the respective counters 19,18. After setting or resetting of FF20, the respective carry information has to be terminated in order to avoid malfunction of FF20 or erroneous carry information at the restart of the counters. This, for example, can be done easily by presetting the counters for the time they are disabled.

The basic cycle output of the output frequency is determined by the time required for both counters 18 and 19 to count through their respective ranges sequentially. This time is independent of the number contained in the pulse length control counter 25: when the numbers in counters 18 and 25 are found to be equal, FF21 is reset, but counter 18 continues counting up to the carry condition. Thus, below the maximum count of cycle counter 18, a part of the pause between pulses occurs with the pause counter 19 still being disabled then, upon enabling of the pause counter 19, adding its pause time duration of 0.5 ms. This way a constant base frequency is obtained.

THE METHOD

The generator can be built by software and need not be built by special hardware like the circuitry of FIG. 2, which is only generally illustrative. For example, the counters 18 and 19, used alternatively, can be combined by using one counter of 6 bit with the comparator also handling 6 bits. Small microprocessors, however, prefer to operate on 4 bits.

The program is realized using a waiting loop which is entered with the accumulators loaded with a number defining the time to be waited. One cycle of the output frequency N(=count number of pulse length control counter 25) corresponds to operation of counter 18.
Loop:

Output (30 high)
Wait N·32 μs
Output (30) low
Wait (16−N)·32 microseconds
Wait 25·32 microseconds operation of counter 19; increment pulse counter 27 skip on carry to an outer loop, i.e., do something else for 800 ms; then re-enter loop. The total time of this loop is independent of N, thus resulting in a constant output frequency. Beeps of 800 Hz, by experience, are found to be well audible in a car.

Various other changes and modifications may be made within the scope of the inventive concept.

I claim:

1. Tone signal generator, particularly warning tone generator to provide a tone rising in intensity during the occurrence thereof comprising
   a digital pulse generator (10) providing pulses of constant pulse repetition frequency and of a controlled varying pulse length, or duty cycle;
   a pulse train or sequence control means (11) connected to and controlling the pulse generator (10) to control emission of the pulses in sequential grouped trains or sequences of pulses in which the pulses of any train, or sequency are of similar pulse length and the number of pulses, in any train as well as the pauses between sequential pulse trains are controlled by said pulse train or sequence control means,
   said pulse trains and pauses defining the repetition of the warning tone;
   a pulse length modulation control means (12) connected to and controlling the pulse generator (10) for selective control of the length of the pulses in respective sequential pulse trains or sequences, to provide for at least one pulse train subsequent to a prior pulse train in which the length of the pulses in said subsequent pulse train is longer than the length of the pulses of the preceding pulse train;
   a filter (13) tuned to the frequency of the pulses in the pulse trains or sequences connected to receive the pulses from the pulse generator (10) and providing said tone signal; and
   wherein the pulse repetitoin frequency provided by said tone generator is the frequency of the tone signal.

2. Tone signal generator according to claim 1 wherein the filter (13) comprises a bandpass filter (14) having a bandpass range within the constant pulse repetition frequency of the pulse generator.

3. Tone signal generator according to claim 1, wherein the pulse generator (10) provides square wave output pulses to the filter (13).

4. Tone signal generator according to claim 1, wherein the pulse generator (10) provided square wave pulses at an output terminal (30) thereof;
   and wherein a wave-shaping circuit (15) is provided, connected between the output terminal (30) of the pulse generator and the filter (13) and converting the square wave pulses from the pulse generator (10) to sawtooth-wave-shaped pulses having a gradually rising leading edge and a sharply dropping trailing edge.

5. Tone signal generator according to claim 1, wherein the pulse generator, the pulse train or sequence control means (11) and the pulse length modulation control means (12) comprise a micro-processor.

6. Tone signal generator according to claim 1 wherein the pulses in the trains or sequence have a pulse repetition frequency in the order of about 800 Hz.

7. Tone signal generator according to claim 1 wherein the pulses in a subsequent pulse train or sequence are twice as long than the pulses in the preceding pulse train or sequence.

8. Tone signal generator according to claim 1 wherein pulses in two sequential trains or sequences have similar pulse lengths, and the pulses in a third sequential train or sequence has a pulse length which is twice that of the pulses in the preceding train or sequence.

9. Tone signal generator according to claim 7 wherein the pulse generator (10) provides square wave pulse at an output temrinal (30) thereof;

and wherein a wave-shaping circuit (15) is provided, connected between the output terminal (30) of the pulse generator and the filter (13) and converting the square wave pulses from the pulse generator (10) to sawtooth-wave-shaped pulses having a gradually rising leading edge and a sharply dropping trailing edge.

10. Tone signal generator according to claim 4 wherein the wave shaping circuit comprises
   a resistor (34) connected between the ooutput terminal (30) of said pulse generator (10) and an input of said filter (14);
   a capacitor (33) coupled between the input of said filter and a reference potential; and
   a discharge diode (35) connected in parallel with said resistor.

11. Tone signal generator according to claim 4 wherein the wave shaping circuit comprises
   a resistor (41) having a control input connected to the output terminal (30) of said pulse generator;
   a transistor (41) having emitter-collector, or drain-source terminals;
   a capacitor (3) connected across the emitter-collector or drain-source terminals of the transistor;
   a common junction (42) between one of the main current path terminals of said transistor (41) and one terminal of said capacitor;
   a resistor (38) connected to said common junction; and wherein said resistor and capacitor each have a free terminal; and
   a source of dc voltage (40) is provided, connected across the free terminals of the resistor and the capacitor; and
   wherein said common junction is further coupled to an input of said filter (14).

12. Tone signal generator according to claim 5, wherein the microprocessor includes
   an output transistor (41) having a drain or collector terminal;
   and a wave shaping circuit comprising a capacitor (39) connected across the drain and source terminals of said output transistor;
   the control input of said output transistor being coupled to an output terminal (30) of said pulse generator (10);
   a common junction (42) between said drain terminal of the transistor (41) and one terminal of said capacitor;
   a resistor (38) connected to the common junction;
   a source of direct current voltage (40) connected to a free terminal of said resistor (38) and said capacitor (39);

and wherein said common junction is further coupled to an input to said filter.

13. Method of generating a warning tone of increasing level in a warning tone generator, comprising the steps of
   (a) counting clock pulses at a first counting rate (50 kHz) to a first predetermined number to determine the number of pulses in a pulse train;
   (b) counting clock pulses to a second predetermined number to determine an initial length of the pulses in said pulse train,
and generating an "end of pulse" signal when said second predetermined number is reached;
   (c) continuing counting clock pulses up to a predetermined maximum number corresponding to the maximum pulse length and a minimum pulse gap for any pulse-pulse gap combination,
wherein the predetermined maximum number corresponds to a maximum pulse length and a minimum pulse gap length counted at said rate of clock pulses (50 kHz) to result in a pulse repetition frequency corresponding to the frequency of said warning tone;
   (d) generating a carry condition pulse when said maximum number is counted;
   (e) applying said carry condition pulse to an output terminal of the warning tone generator;
   (f) repeating the steps c; d; e until said first predetermined number is reached,
whereby a pulse train will comprise pulses of a length being a function of said second predetermined number and of a repetition rate being a function of said maximum number;
   (g) counting clock pulses at said first counting rate (50 kHz) to a third predetermined number to determine the length of pauses between pulse trains;
   (h) incrementing said second predetermined number to increase the length of the pulses in said pulse train;
then repeating steps a–g
   (i) whereby a pulse train comprising the pulses of a length which is a function of the incremented second predetermined number and of the repetition rate which is a function of said maximum number is obtained,
and wherein the resulting warning tone will be pulses of increasing amplitude due to the longer pulse, but of the same frequency, or pitch due to the coounting at said same rate to the same maximum number.

14. Method according to claim 13, including the step of filtering the thus obtained pulses with resepct to the repetition frequency of the pulse train.

15. Method according to claim 13, including the step of bandpass filtering the thus obtained pulses of the pulse train with respect to the repetition frequency thereof.

16. The method of claim1 3 wherein said carry condition pulses applied to the output terminal of the pulse tone generator are essentially square wave pulses;
   and further including the steps of converting said essentially square wave pulses into sawtooth-wave-shaped pulses having gradually rising leading edges and sharply dropping trailing edges.

17. Method according to claim 16, further including the step of bandpass filtering the sawtooth wave pulses with respect to their repetition frequency.

18. The metod of claim 13 wherein said first counting rate (50 kHz) of the clock pulses, and said maximum number are respectively dimensioned to result in a pulse repetition frequency, or frequency of said warning tone of about 800 Hz.

19. The method of claim 13, including the steps of repeating the steps of c, d, e, f, and g before carrying out said step of h to provide for sequential pulse trains in which the individual pulses have the same pulse length to provide sequential tone pulses of the same amplitude.

* * * * *